US012804971B2

(12) United States Patent
Zou et al.

(10) Patent No.: US 12,804,971 B2

(45) Date of Patent: Nov. 17, 2026

(54) BACKSIDE SOURCE/DRAIN CONTACTS WITHOUT INNER SPACERS

(71) Applicant: INTERNATIONAL BUSINESS MACHINES CORPORATION, Armonk, NY (US)

(72) Inventors: Lijuan Zou, Albany, NY (US); Tao Li, Slingerlands, NY (US); Ruilong Xie, Niskayuna, NY (US); Reinaldo Vega, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 338 days.

(21) Appl. No.: 18/738,481

(22) Filed: Jun. 10, 2024

(65) Prior Publication Data

US 2025/0380474 A1 Dec. 11, 2025

(51) Int. Cl.

| | |
|---|---|
| ***H01L 29/08*** | (2006.01) |
| ***H10D 30/01*** | (2025.01) |
| ***H10D 30/43*** | (2025.01) |
| ***H10D 30/67*** | (2025.01) |
| ***H10D 62/10*** | (2025.01) |
| ***H10D 62/13*** | (2025.01) |
| ***H10D 64/01*** | (2025.01) |
| ***H10D 84/01*** | (2025.01) |
| ***H10D 84/03*** | (2025.01) |
| ***H10D 84/83*** | (2025.01) |

(52) U.S. Cl.

CPC ......... *H10D 62/121* (2025.01); *H10D 30/014* (2025.01); *H10D 30/43* (2025.01); *H10D 30/6735* (2025.01); *H10D 30/6757* (2025.01); *H10D 62/151* (2025.01); *H10D 64/017* (2025.01); *H10D 84/0128* (2025.01); *H10D 84/038* (2025.01); *H10D 84/83* (2025.01)

(58) Field of Classification Search

None

See application file for complete search history.

(56) References Cited

U.S. PATENT DOCUMENTS

| | | | | |
|---|---|---|---|---|
| 9,502,518 | B2 | 11/2016 | Liu et al. | |
| 9,647,139 | B2 | 5/2017 | Doris et al. | |
| 10,424,651 | B2 | 9/2019 | Cheng et al. | |
| 11,183,562 | B2 * | 11/2021 | Yi | B82Y 10/00 |
| 11,569,237 | B2 | 1/2023 | Kim et al. | |
| 11,581,414 | B2 | 2/2023 | Liaw | |
| 12,382,716 | B2 * | 8/2025 | Jeong | H10D 62/151 |
| 2017/0221708 | A1 | 8/2017 | Bergendahl et al. | |
| 2023/0093101 | A1 | 3/2023 | Xie et al. | |
| 2023/0100665 | A1 | 3/2023 | Mochizuki et al. | |
| 2023/0361112 | A1 | 11/2023 | Hong et al. | |
| 2023/0395600 | A1 * | 12/2023 | Xie | H10D 30/014 |
| 2023/0411529 | A1 | 12/2023 | Kim et al. | |

(Continued)

*Primary Examiner* — Long Pham

(74) *Attorney, Agent, or Firm* — Harrity & Harrity, LLP

(57) ABSTRACT

A semiconductor device includes a nanosheet channel and a first two-part source/drain structure at a first side surface of the nanosheet channel. The first two-part source/drain structure includes a sidewall that has a doped first semiconductor material and a fill that has a doped second semiconductor material. A backside conductive contact makes contact with the first two-part source/drain structure. Substrate remnants are at corners between the backside conductive contact and the two-part source/drain structure.

20 Claims, 7 Drawing Sheets

(56) References Cited

U.S. PATENT DOCUMENTS

| | | | | |
|---|---|---|---|---|
| 2023/0420518 | A1* | 12/2023 | Kim | H10D 30/014 |
| 2025/0287659 | A1* | 9/2025 | Lim | H10D 30/014 |
| 2026/0150369 | A1* | 5/2026 | Natarajan | H10D 30/43 |

* cited by examiner

BACKSIDE SOURCE/DRAIN CONTACTS WITHOUT INNER SPACERS

BACKGROUND

The present invention generally relates to semiconductor device fabrication and, more particularly, to nanosheet field effect transistor (FET) fabrication.

Nanosheet FETs may be formed with inner spacers that separate the nanosheet channels from one another and that further separate the gate stack from source/drain structures. FETs may further be formed that have conductive contacts from the back side of the device.

SUMMARY

A semiconductor device includes a nanosheet channel and a first two-part source/drain structure at a first side surface of the nanosheet channel. The first two-part source/drain structure includes a sidewall that has a doped first semiconductor material and a fill that has a doped second semiconductor material. A backside conductive contact makes contact with the first two-part source/drain structure. Substrate remnants are at corners between the backside conductive contact and the two-part source/drain structure.

A semiconductor device includes a nanosheet channel and a first two-part source/drain structure at a first side surface of the nanosheet channel. The first two-part source/drain structure includes a sidewall that has a doped first semiconductor material and a fill that has a doped second semiconductor material. A second two-part source/drain structure is at a second side surface of the nanosheet channel and includes sidewall and a fill. A backside conductive contact makes contact with the first two-part source/drain structure. A frontside conductive contact makes contact with the second two-part source/drain structure. Substrate remnants are at corners between the backside conductive contact and the two-part source/drain structure.

A semiconductor device includes a nanosheet channel and a first two-part source/drain structure at a first side surface of the nanosheet channel. The first two-part source/drain structure includes a sidewall that has a doped first semiconductor material and a fill that has a doped second semiconductor material. A second two-part source/drain structure is at a second side surface of the nanosheet channel and includes a sidewall and a fill. A backside conductive contact makes contact with the first two-part source/drain structure. A frontside conductive contact makes contact with the second two-part source/drain structure. A semiconductor placeholder is in contact with a back surface of the second two-part source/drain structure. Substrate remnants are at corners between the backside conductive contact and the two-part source/drain structure and between the semiconductor placeholder and the second two-part source/drain structure.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Nanosheet field effect transistors (FETs) may omit the use of inner spacers-dielectric structures that separate vertically adjacent channels from one another and that further electrically insulate the FET's gate stack from source/drain structures. In FETs that omit inner spacers, the gate dielectric may be used to insulate the gate conductor from the source/drain structures. While this may result in a higher capacitance than inner spacers would, the omission of inner spacers provides superior gate control at the edges of the nanosheet channels.

However, the fabrication process may be complicated without the use of such inner spacers, as the removal of the substrate to form backside contacts may cause damage to the sidewalls of the source/drain epitaxial material. To prevent this damage, the removal of the substrate may be stopped before the substrate material is completely removed. This leaves in place semiconductor corner structures that provide protection to the source/drain structures when the backside contacts are formed.

Figure 1:
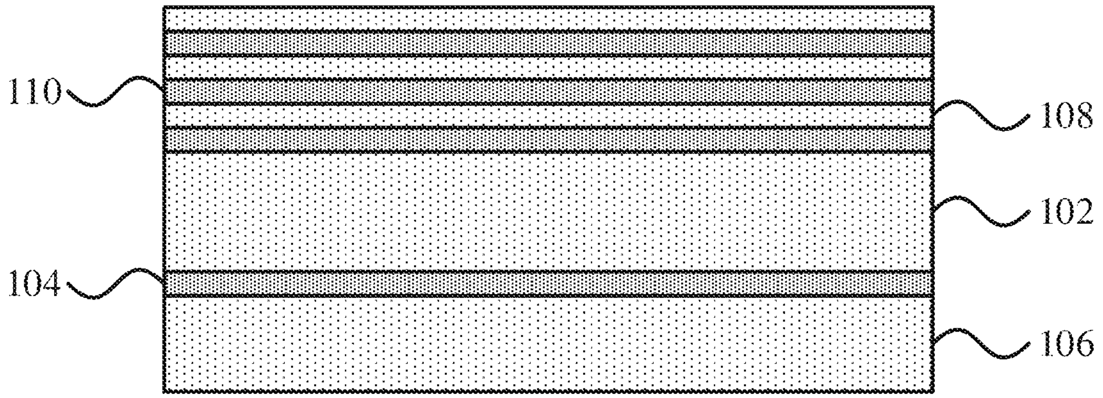
FIG. 1 is a cross-sectional view of a step in the fabrication of a nanosheet semiconductor device that has backside contacts and no inner spacers, showing the formation of a set of alternating semiconductor layers on a substrate, in accordance with an embodiment of the present invention.

Referring now to FIG. 1, a cross-sectional view of a step in the fabrication of a semiconductor device is shown. A semiconductor device substrate 102 is formed on an etch stop layer 104, with a handler substrate 106 underneath it. The etch stop layer 104 may be formed from any appropriate material that has etch selectivity with respect to the semiconductor device substrate.

A series of stacked semiconductor layers is formed on the semiconductor device substrate 102, including one or more channel layers 108 and sacrificial layers 110. The channel layers 108 and the sacrificial layers 110 may be formed from successive epitaxial growth processes, with each new layer being epitaxially grown from a top surface of a previous layer or from the semiconductor device substrate 102.

The semiconductor device substrate 102 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the semiconductor device substrate 102 may also be a semiconductor on insulator (SOI) substrate.

The terms "epitaxial growth" and/or "epitaxial deposition" refer to the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

The channel layers 108 and the sacrificial layers 110 may therefore be formed from material that is crystallographically compatible with the material of the semiconductor device substrate 102. The sacrificial layers 110 may furthermore be formed from a material that can be selectively etched with respect to the channel layers 108 and the semiconductor device substrate. In some embodiments, the channel layers 108 and the semiconductor device substrate 102 may be formed from silicon, while the sacrificial layers 110 may be formed from silicon germanium that has a germanium concentration selected to be selectively etchable with respect to silicon (e.g., between about 30% and about 60%). As used herein, the term "selective" in reference to a material removal process denotes that the rate of material removal for a first material is greater than the rate of removal for at least another material of the structure to which the material removal process is being applied.

Figure 2:
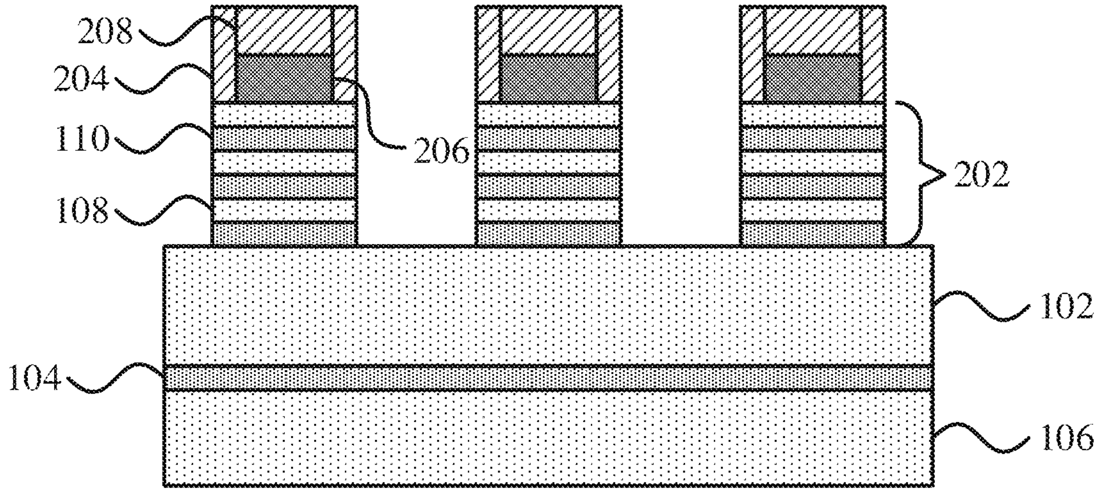
FIG. 2 is a cross-sectional view of a step in the fabrication of a nanosheet semiconductor device that has backside contacts and no inner spacers, the formation of dummy gates and etching into the alternating semiconductor layers to form stacks, in accordance with an embodiment of the present invention.

Referring now to FIG. 2, a cross-sectional view of a step in the fabrication of a semiconductor device is shown. Dummy gates 206 are formed over the channel layers 108 and the sacrificial layers 110, for example by forming a mask 208 and dummy gate spacers 204 and then performing one or more anisotropic etches to remove exposed material, until the top surface of the semiconductor device substrate 102 is exposed.

The dummy gates 206 may be formed from any appropriate material, such as polycrystalline silicon. The mask 208 may be formed by a photolithographic process. For example, a pattern may be produced by applying a photoresist to the surface to be etched. The photoresist may be exposed to a pattern of radiation. The pattern may then be developed into the photoresist utilizing a resist developer. Once the patterning of the photoresist is completed, the sections covered by the photoresist are protected while the exposed regions are removed using a selective etching process that removes the unprotected regions, leaving behind the mask 208. The mask 208 may be formed from any appropriate hardmask material, such as silicon nitride.

After formation of the mask 208 on a layer of dummy gate material, the dummy gate material may be anisotropically and selectively etched to form the dummy gates 206. The etch of the dummy gate material may be performed using reactive ion etching (RIE), which is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface.

The dummy gate spacers 204 may then be formed by conformally depositing a dielectric material, such as silicon nitride or siliconborocarbonitride (SiBCN), and then selectively and anisotropically etching the dielectric material from horizontal surfaces, leaving the sidewalls behind. The mask 208 and dummy gate spacers 204 together form a mask that may be used for a selective, anisotropic etch of the underlying semiconductor layers to form stacks 202.

Various deposition processes may be used herein for different purposes, such as chemical vapor deposition (CVD), physical vapor deposition (PVD), atomic layer deposition (ALD), or gas cluster ion beam (GCIB) deposition. Some deposition processes, such as ALD, may deposit material conformally, whereas others, such as PVD or GCIB, may provide a more directional deposition. CVD may range from highly conformal to highly non-conformal depending on the formulation.

CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Figure 3:
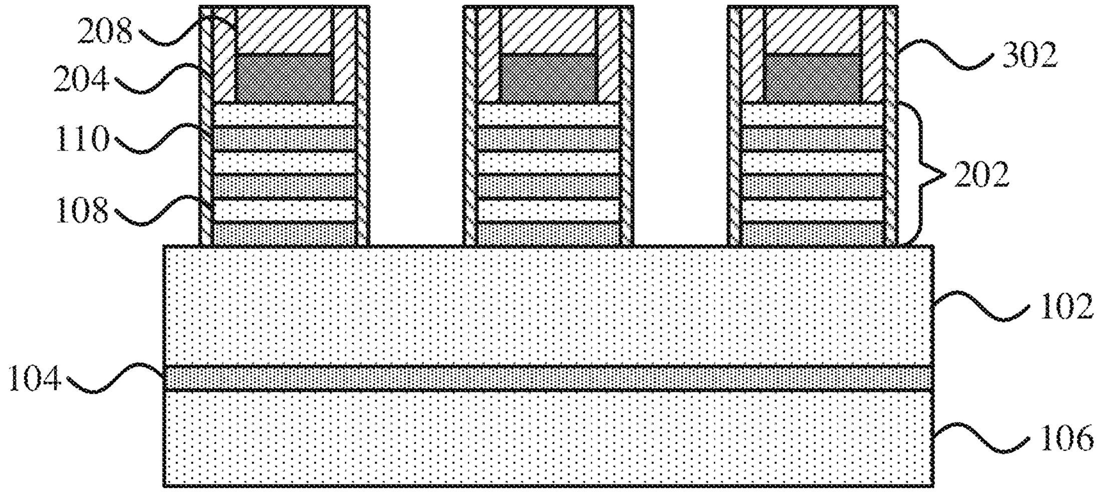
FIG. 3 is a cross-sectional view of a step in the fabrication of a nanosheet semiconductor device that has backside contacts and no inner spacers, showing the formation of a protective dielectric liner on sidewalls of the stacks, in accordance with an embodiment of the present invention.

Referring now to FIG. 3, a cross-sectional view of a step in the fabrication of a semiconductor device is shown. A dielectric liner 302 is formed on vertical surfaces, for example by a conformal deposition of dielectric material, such as silicon dioxide or silicon nitride, followed by a selective, anisotropic etch to remove the dielectric material from horizontal surfaces. The dielectric liner 302 serves to protect the side surfaces of the stacks 202.

Figure 4:
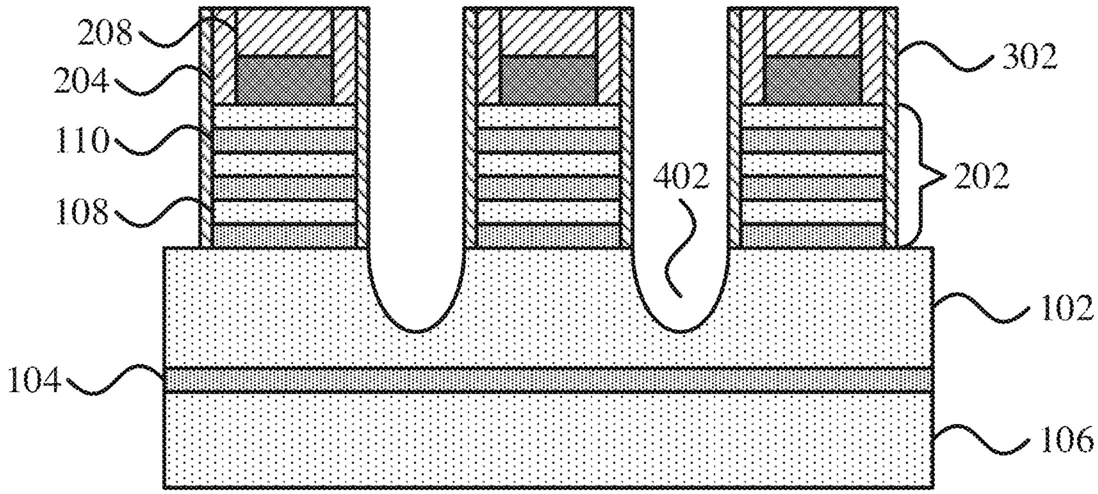
FIG. 4 is a cross-sectional view of a step in the fabrication of a nanosheet semiconductor device that has backside contacts and no inner spacers, showing an etch of the substrate to form trenches between the stacks, in accordance with an embodiment of the present invention.

Referring now to FIG. 4, a cross-sectional view of a step in the fabrication of a semiconductor device is shown. A selective anisotropic etch is used to remove material from the semiconductor device substrate 102 to create trenches 402 between the stacks 202.

Figure 5:
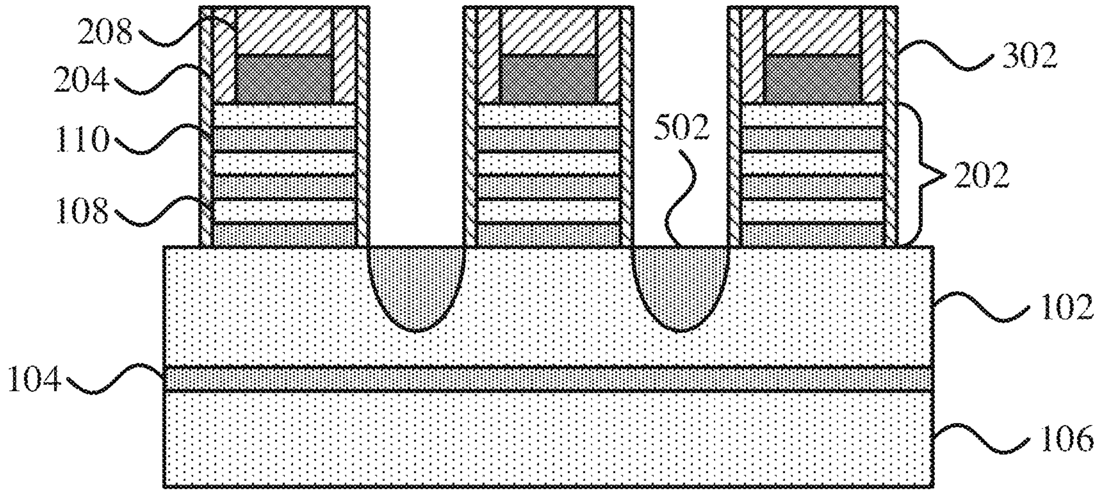
FIG. 5 is a cross-sectional view of a step in the fabrication of a nanosheet semiconductor device that has backside contacts and no inner spacers, showing the formation of semiconductor placeholder structures in the trenches, in accordance with an embodiment of the present invention.

Referring now to FIG. 5, a cross-sectional view of a step in the fabrication of a semiconductor device is shown. Placeholder structures 502 are formed in the trenches 402, for example by depositing a sacrificial semiconductor material, such as silicon germanium, and then etching the sacrificial semiconductor material back. The dielectric liner 302 protects the sidewalls of the sacrificial layers 110 during this etch back process.

The silicon germanium of the placeholder structures 502 may have a different germanium concentration as compared to the sacrificial layers 110. For example, the sacrificial layers 110 may be formed with a higher germanium concentration (e.g., about 60%) and the placeholder structures 502 may be formed with a lower germanium concentration (e.g., about 30%), so that a selective etch may later be performed that targets the sacrificial layers 110 first.

Figure 6:
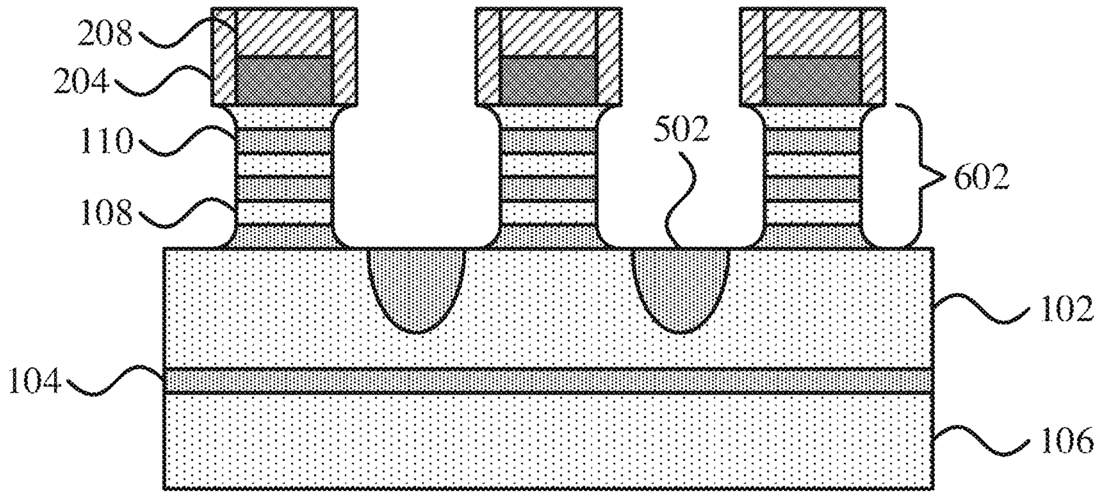
FIG. 6 is a cross-sectional view of a step in the fabrication of a nanosheet semiconductor device that has backside contacts and no inner spacers, showing etching of the sidewalls of the stacks, in accordance with an embodiment of the present invention.

Referring now to FIG. 6, a cross-sectional view of a step in the fabrication of a semiconductor device is shown. The dielectric liner 302 is selectively etched away to expose the sidewalls of the stacks 202. The stacks 202 are then etched using an isotropic selective dry etch that affects both the channel layers 108 and the sacrificial layers 110, producing bow-etched stacks 602. For example, the selective dry etch may include gas phased isotropic chemical etch that targets silicon. At this time, the bottommost sacrificial layer 110 will protect the semiconductor device substrate 102. A different dry etch chemistry may be used to target the sacrificial layers 110 without affecting the placeholder 502, which may have a different germanium concentration.

Figure 7:
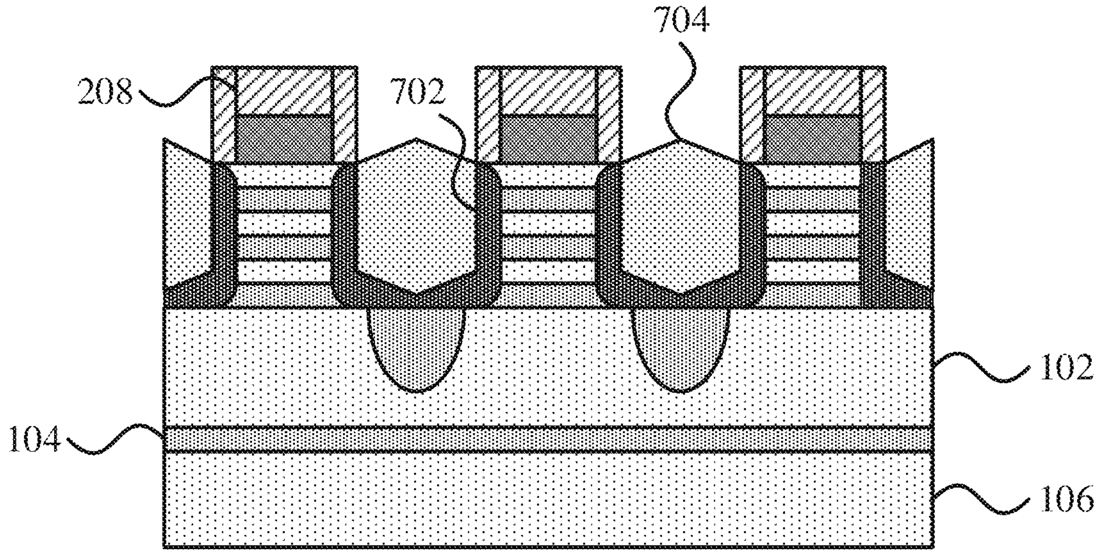
FIG. 7 is a cross-sectional view of a step in the fabrication of a nanosheet semiconductor device that has backside contacts and no inner spacers, showing the formation of two-part source/drain structures, in accordance with an embodiment of the present invention.

Referring now to FIG. 7, a cross-sectional view of a step in the fabrication of a semiconductor device is shown. Source/drain structures are epitaxially grown from sidewalls of the channel layers 108 and the sacrificial layers 110, for example using in situ doped silicon. For example, boron-doped silicon may be used in this instance, but it should be understood that any appropriate n-type or p-type dopant may be used instead. This first epitaxial growth step creates a source/drain sidewall 702 and is halted before the epitaxial material fills the space between bow-etched stacks 602.

A second epitaxial growth process is then performed to fill the space between the bow-etched stacks 602, for example using a distinct semiconductor material, such as in situ doped silicon germanium, forming source/drain fill 704. In this instance boron-doped silicon germanium may be used, though it should be understood that any appropriate n-type or p-type dopant may be used to match the properties of the source/drain sidewall 702.

This two-part source/drain structure, including the source/drain sidewall 702 and the source/drain fill 704, uses the source/drain sidewall 702 as a buffer between the sacrificial layers 110 and the material of the source/drain fill 704. This prevents damage to the source/drain fill 704 when the sacrificial layers 110 are later removed, as they may be formed from similar materials.

Figure 8:
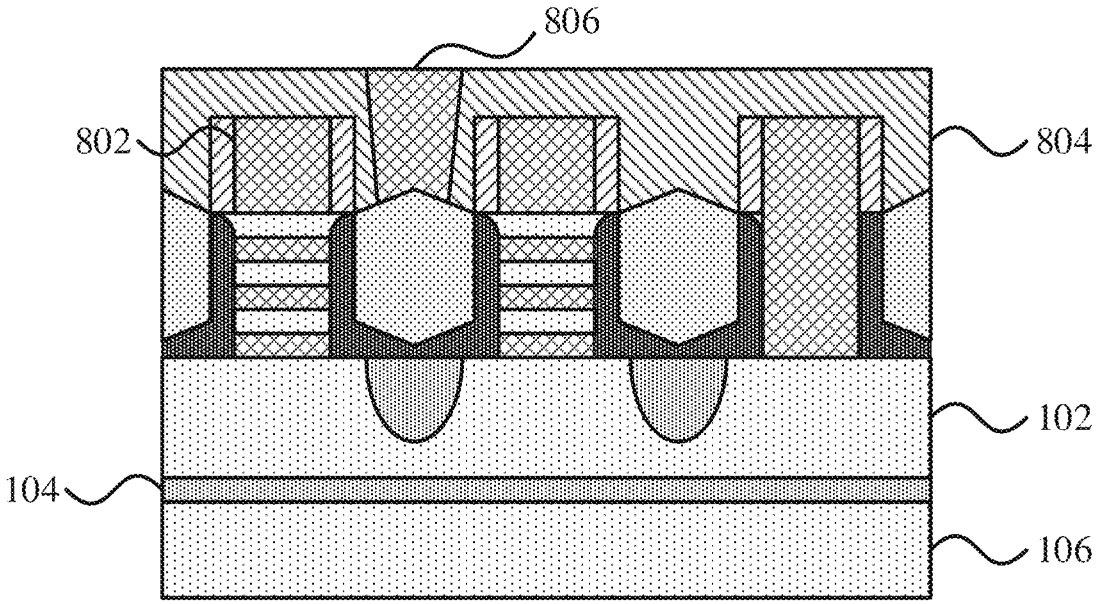
FIG. 8 is a cross-sectional view of a step in the fabrication of a nanosheet semiconductor device that has backside contacts and no inner spacers, showing the formation of a frontside interlayer dielectric and contacts, in accordance with an embodiment of the present invention.

Referring now to FIG. 8, a cross-sectional view of a step in the fabrication of a semiconductor device is shown. The dummy gates 206, the mask 208, and the sacrificial layers 110 are etched away in selective etches, exposing the channel layers 108 and leaving them suspended between the source/drain sidewalls 702.

The dummy gates 206 are replaced by a gate stack 802. The gate stack 802 may include a gate dielectric layer, an optional work function metal layer, and a gate conductor. The gate dielectric layer may provide electrical insulation between the gate conductor and the source/drain sidewalls 702.

The gate dielectric layer may be formed from a high-k dielectric material. Examples of high-k dielectric materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as lanthanum and aluminum.

The work function metal layer may be any appropriate n-type or p-type work function metal layer and may be formed on the gate dielectric layer before the gate conductor is formed, thereby tuning electrical properties of the FET such as the voltage threshold.

The gate conductor may be formed from any appropriate conductive metal such as, e.g., tungsten, nickel, titanium, molybdenum, tantalum, copper, platinum, silver, gold, ruthenium, iridium, rhenium, rhodium, cobalt, and alloys thereof. The gate conductor may alternatively be formed from a doped semiconductor material such as, e.g., doped polysilicon.

A frontside interlayer dielectric 804 may be formed by depositing dielectric material, such as silicon dioxide, using any appropriate deposition process. Frontside contacts 806 may be formed by etching vias through the frontside interlayer dielectric 804 and filling the vias with conductive material. Excess conductive material may be removed by a chemical mechanical planarization (CMP) process. Additional layers may be formed over the interlayer dielectric, such as back-end-of-line (BEOL) layers that provide signal and/or power connections to frontside contacts of the FETs.

CMP is performed using, e.g., a chemical or granular slurry and mechanical force to gradually remove upper layers of the device. The slurry may be formulated to be unable to dissolve, for example, the frontside interlayer dielectric 804, resulting in the CMP process's inability to proceed any farther than that layer.

Figure 9:
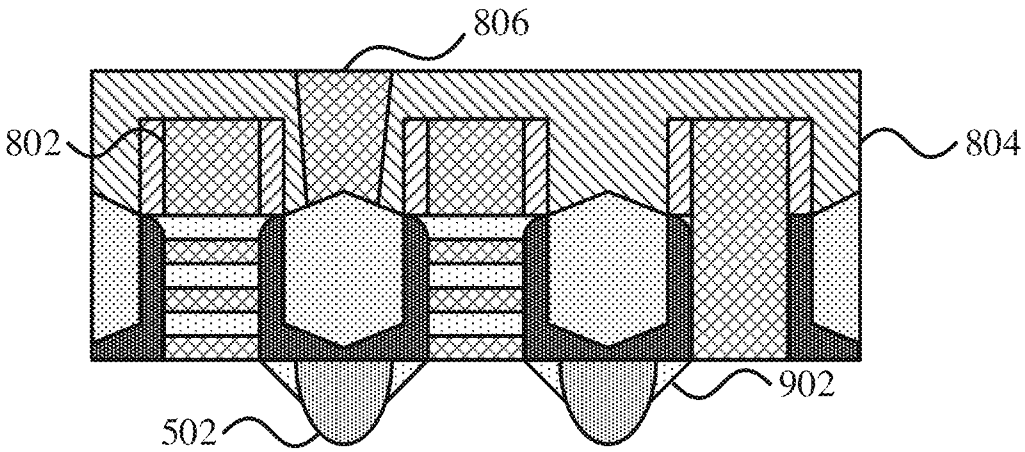
FIG. 9 is a cross-sectional view of a step in the fabrication of a nanosheet semiconductor device that has backside contacts and no inner spacers, showing the incomplete removal of the semiconductor substrate, in accordance with an embodiment of the present invention.

Referring now to FIG. 9, a cross-sectional view of a step in the fabrication of a semiconductor device is shown. The handler substrate 106, the etch stop layer 104, and most of the semiconductor device substrate 102 are etched away, leaving substrate remnants 902 in corners. These substrate remnants 902 result from an incomplete etch of the semiconductor device substrate 102, as the etch is slower in areas that are partially protected by neighboring structures. The substrate remnants 902 are left in place to prevent damage to the source/drain sidewalls 702 during removal of the semiconductor device substrate 102.

Figure 10:
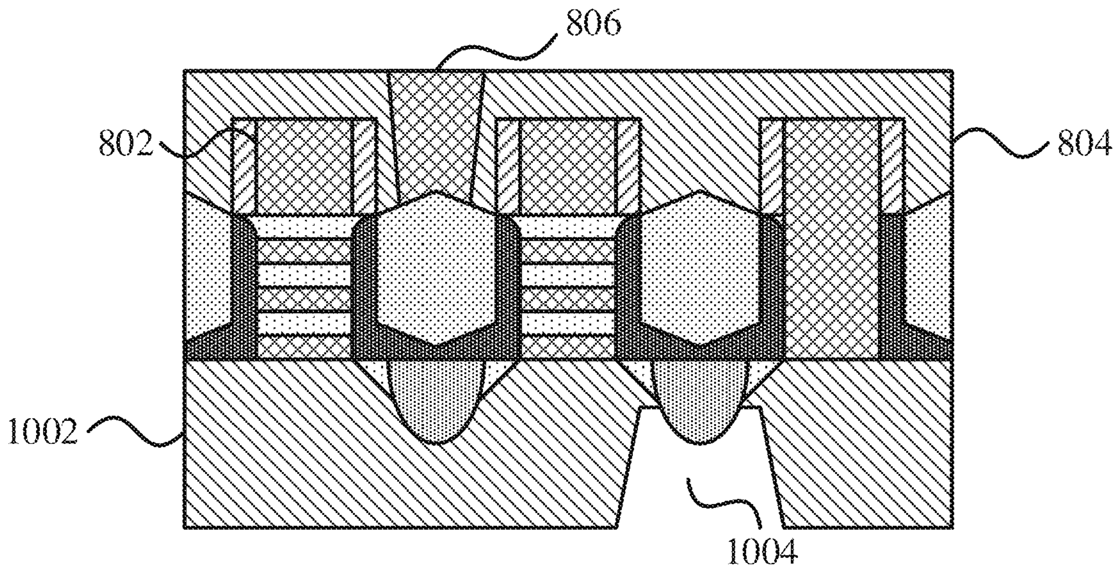
FIG. 10 is a cross-sectional view of a step in the fabrication of a nanosheet semiconductor device that has backside contacts and no inner spacers, showing the formation of a backside interlayer dielectric that exposes a placeholder structure, in accordance with an embodiment of the present invention.

Referring now to FIG. 10, a cross-sectional view of a step in the fabrication of a semiconductor device is shown. A backside interlayer dielectric 1002 is formed on the placeholder structures 502. A via 1004 may be etched in the interlayer dielectric using any appropriate masking and selective anisotropic etching process to expose part of a placeholder structure 502.

Figure 11:
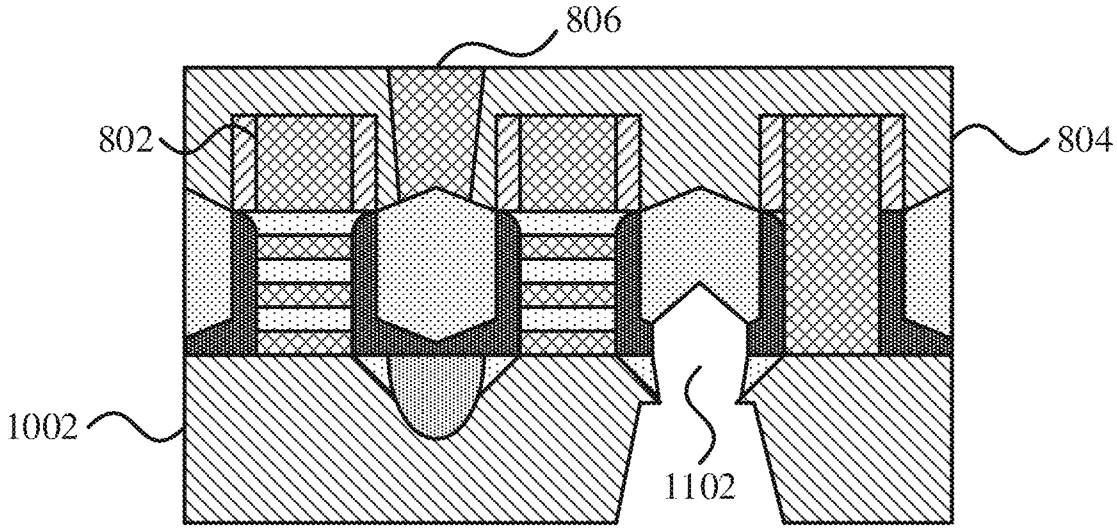
FIG. 11 is a cross-sectional view of a step in the fabrication of a nanosheet semiconductor device that has backside contacts and no inner spacers, showing the removal of the placeholder structure and etch into a source/drain structure, in accordance with an embodiment of the present invention.

Referring now to FIG. 11, a cross-sectional view of a step in the fabrication of a semiconductor device is shown. The exposed placeholder structure 502 is selectively etched away using any appropriate isotropic or anisotropic etch process. One or more additional etches may be used to remove the bottom of the source/drain sidewalls 702 and the source/drain fill 704 to create cavity 1102. The cavity 1102 may penetrate through the bottom of the source/drain sidewalls 702 and into the source/drain fill 704.

Figure 12:
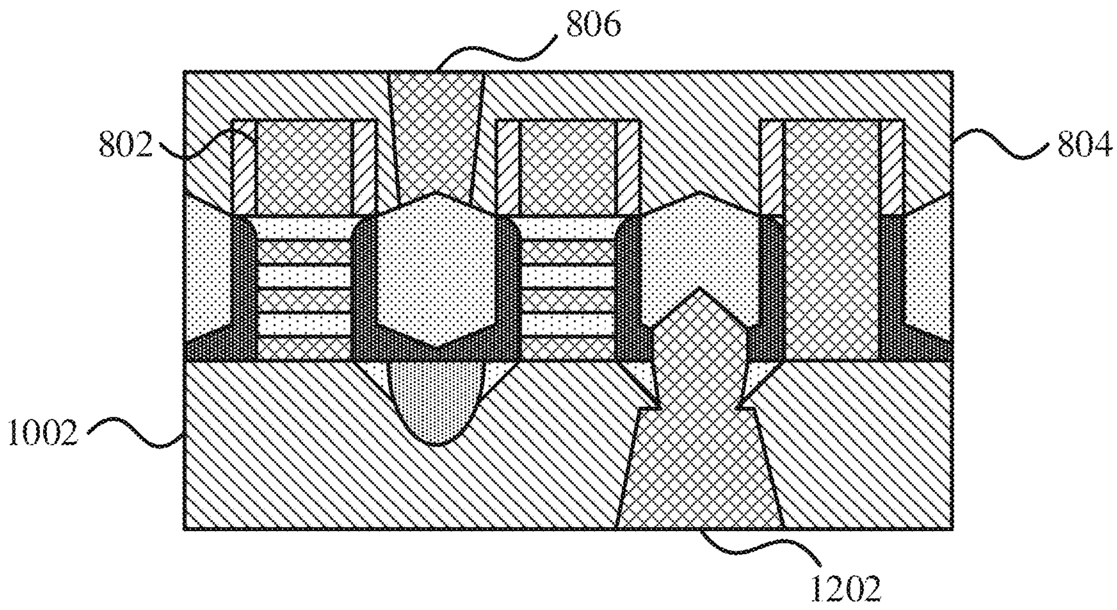
FIG. 12 is a cross-sectional view of a step in the fabrication of a nanosheet semiconductor device that has backside contacts and no inner spacers, showing the formation of backside contact to the source/drain structure, in accordance with an embodiment of the present invention.
Figure 13:
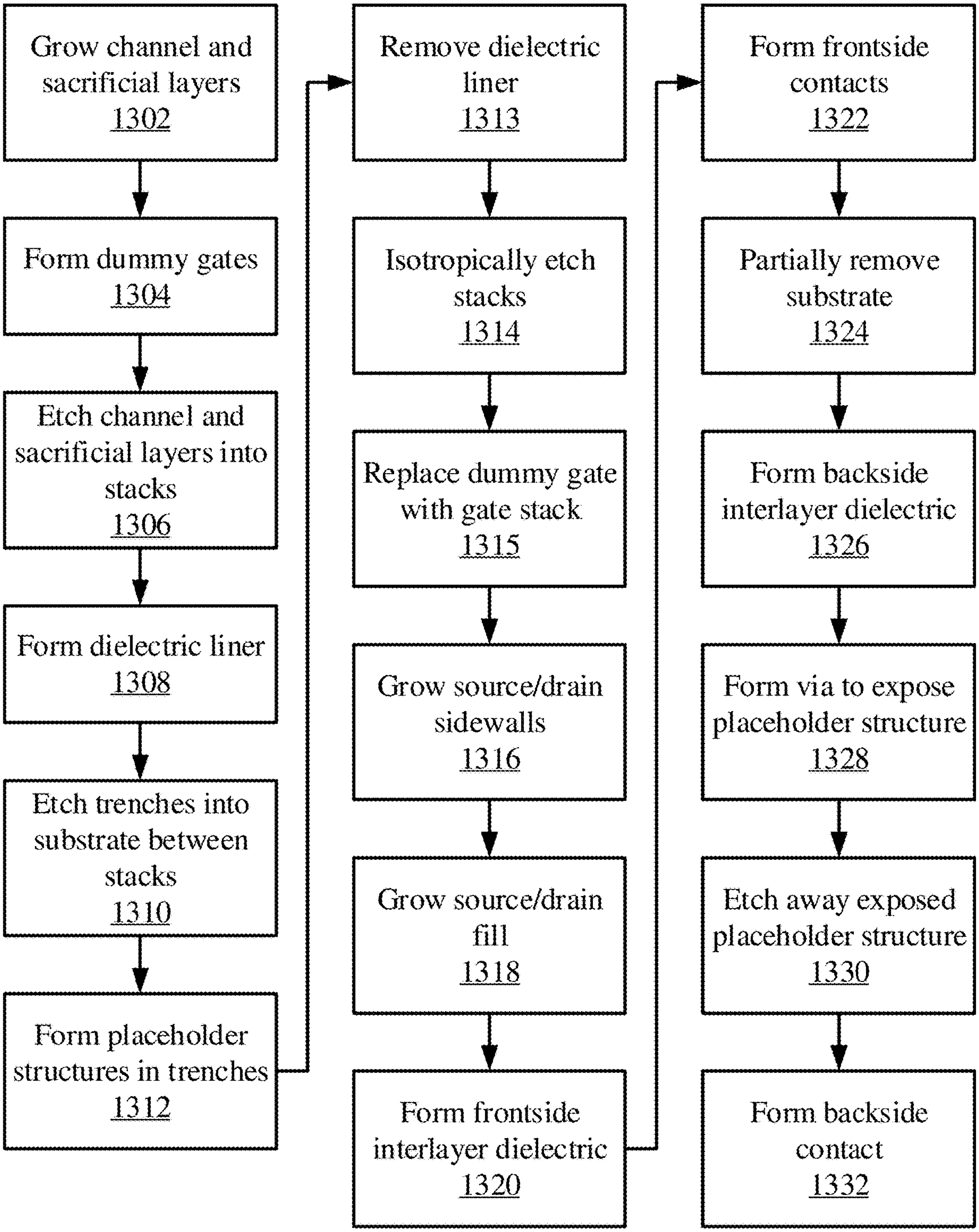
FIG. 13 is a block/flow diagram of a method of fabricating a nanosheet semiconductor device that has backside contacts and no inner spacers, in accordance with an embodiment of the present invention.

Referring now to FIG. 12, a cross-sectional view of a step in the fabrication of a semiconductor device is shown. The cavity 1102 is filled with a conductive material to form backside contact 1202. Excess conductive material may be removed by a CMP process. Additional layers may be formed over the interlayer dielectric, such a backside power distribution network that provides or power connections to backside contacts 1202 of the FETs.

Referring now to FIG. 12, a method of forming a semiconductor device is shown. Block 1302 epitaxially grows the semiconductor channel layers 108 and sacrificial layers 110 from the top surface of the semiconductor device substrate 102. Block 1304 forms dummy gates 206 over the semiconductor layers. Block 1306 uses a mask 208 and dummy gate spacers 204 to anisotropically etch into the semiconductor layers to form stacks 202, for example using one or more selective anisotropic etches.

Block 1308 forms dielectric liner 302 on sidewalls of the stacks 202, for example by conformally depositing a thin layer of dielectric material and then selectively and anisotropically etching that dielectric material away from horizontal surfaces. Block 1310 then selectively and anisotropically etches trenches 402 into the semiconductor device substrate 102 in the areas between the stacks 202. Block 1312 forms placeholder structures 502 in the trenches 402, for example by growing a semiconductor material from the surface of the trenches 402 or by depositing such a material and then etching it back.

Block 1313 selectively etches away the dielectric liner 302 to expose sidewalls of the stacks 202. Block 1314 performs an isotropic etch of the exposed side surfaces of the channel layers 108 and the sacrificial layers 110 to create bow-etched stacks 602. From the exposed side surfaces of the bow-etched stacks 602, block 1316 epitaxially grows the source/drain sidewalls 702. Block 1318 then epitaxially grows the source/drain fill 704 to form two-part source/drain structures. Block 1319 etches away the dummy gates 206 and the sacrificial layers 110 to expose the channel layers 108 and forms a gate stack, with successive depositions of a gate dielectric layer, an optional work function metal layer, and a gate conductor.

Block 1320 forms frontside interlayer dielectric 804 over the source/drain structures. Block 1322 forms frontside contacts 806, for example by etching vias through the frontside interlayer dielectric and depositing conductive material, with any excess conductive material being removed by a CMP process that stops on the frontside interlayer dielectric 804. Additional layers, such as BEOL layers, can be formed to provide electrical connectivity to the frontside contacts 806.

Working from the back side of the device, block 1324 partially removes the semiconductor device substrate 102 with an etch that selectively, but incompletely, removes the exposed semiconductor material. The partial removal of the semiconductor device substrate 102 leaves substrate remnants 902, which prevent the etch from reaching the source/drain sidewalls 702.

Block 1326 forms a backside interlayer dielectric 1002 by depositing dielectric material over the exposed placeholder structures 502. Block 1328 etches one or more vias to expose one or more respective placeholder structures 502. Block 1330 then etches away the exposed placeholder structure(s) and block 1332 forms a backside contact 1202 by depositing conductive material to fill the resulting cavity 1102. Additional layers, such as a backside power distribution layer, can be formed to provide electrical connectivity to the backside contact 1202.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of backside source/drain contacts without inner spacers (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A semiconductor device, comprising:
- a nanosheet channel;
- a first two-part source/drain structure at a first side surface of the nanosheet channel, including a sidewall that includes a doped first semiconductor material and a fill that includes a doped second semiconductor material;
- a backside conductive contact to the first two-part source/drain structure; and
- substrate remnants at corners between the backside conductive contact and the two-part source/drain structure.

2. The semiconductor device of claim 1, wherein the nanosheet channel is formed from the first semiconductor material.

3. The semiconductor device of claim 1, wherein the first semiconductor material is silicon and the second semiconductor material is silicon germanium.

4. The semiconductor device of claim 1, wherein the substrate remnants are formed from the first semiconductor material.

5. The semiconductor device of claim 1, wherein the backside conductive contact penetrates into the fill of the first two-part source/drain structure.

6. The semiconductor device of claim 1, further comprising:
- a second two-part source/drain structure at second side surface of the nanosheet channel, including a sidewall and a fill; and
- a frontside conductive contact to the second two-part source/drain structure.

7. The semiconductor device of claim 6, wherein the frontside conductive contact makes electrical contact with the fill of the second two-part source/drain structure.

8. The semiconductor device of claim 6, further comprising:
- a semiconductor placeholder in contact with a back surface of the second two-part source/drain structure; and
- substrate remnants at corners between the semiconductor placeholder and the second two-part source/drain structure.

9. The semiconductor device of claim 8, wherein the semiconductor placeholder is formed from the second semiconductor material.

10. A semiconductor device, comprising:

a nanosheet channel;

a first two-part source/drain structure at a first side surface of the nanosheet channel, including a sidewall that includes a doped first semiconductor material and a fill that includes a doped second semiconductor material;

a second two-part source/drain structure at a second side surface of the nanosheet channel, including a sidewall and a fill;

a backside conductive contact to the first two-part source/drain structure;

a frontside conductive contact to the second two-part source/drain structure; and substrate remnants at corners between the backside conductive contact and the two-part source/drain structure.

11. The semiconductor device of claim 10, wherein the nanosheet channel is formed from the first semiconductor material.

12. The semiconductor device of claim 10, wherein the first semiconductor material is silicon and the second semiconductor material is silicon germanium.

13. The semiconductor device of claim 10, wherein the substrate remnants are formed from the first semiconductor material.

14. The semiconductor device of claim 10, wherein the backside conductive contact penetrates into the fill of the first two-part source/drain structure.

15. The semiconductor device of claim 14, wherein the frontside conductive contact makes electrical contact with the fill of the second two-part source/drain structure.

16. The semiconductor device of claim 14, further comprising:

a semiconductor placeholder in contact with a back surface of the second two-part source/drain structure; and substrate remnants at corners between the semiconductor placeholder and the second two-part source/drain structure.

17. The semiconductor device of claim 16, wherein the semiconductor placeholder is formed from the second semiconductor material.

18. A semiconductor device, comprising:

a nanosheet channel;

a first two-part source/drain structure at a first side surface of the nanosheet channel, including a sidewall that includes a doped first semiconductor material and a fill that includes a doped second semiconductor material;

a second two-part source/drain structure at a second side surface of the nanosheet channel, including a sidewall and a fill;

a backside conductive contact to the first two-part source/drain structure;

a frontside conductive contact to the second two-part source/drain structure;

a semiconductor placeholder in contact with a back surface of the second two-part source/drain structure; and substrate remnants at corners between the backside conductive contact and the two-part source/drain structure and between the semiconductor placeholder and the second two-part source/drain structure.

19. The semiconductor device of claim 18, wherein the backside conductive contact penetrates into the fill of the first two-part source/drain structure.

20. The semiconductor device of claim 18, wherein the frontside conductive contact makes electrical contact with the fill of the second two-part source/drain structure.

* * * * *